United States Patent
Okuyama

(10) Patent No.: US 7,893,767 B2
(45) Date of Patent: Feb. 22, 2011

(54) OPERATIONAL AMPLIFIER AND INTEGRATING CIRCUIT

(75) Inventor: Kuniyuki Okuyama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 21 days.

(21) Appl. No.: 12/314,488

(22) Filed: Dec. 11, 2008

(65) Prior Publication Data
US 2009/0167407 A1 Jul. 2, 2009

(30) Foreign Application Priority Data
Dec. 27, 2007 (JP) ............... 2007-337751

(51) Int. Cl.
*H03F 3/45* (2006.01)
(52) U.S. Cl. ............... 330/260; 330/292; 330/302
(58) Field of Classification Search ............... 330/260, 330/292, 302
See application file for complete search history.

(56) References Cited

U.S. PATENT DOCUMENTS

| | | | | |
|---|---|---|---|---|
| 3,654,468 A | * | 4/1972 | Shah | 250/302 |
| 3,663,833 A | * | 5/1972 | Pao et al. | 327/347 |
| 5,315,266 A | * | 5/1994 | Lorenz | 330/294 |
| 7,068,098 B1 | * | 6/2006 | Bell et al. | 330/75 |
| 7,592,870 B2 | * | 9/2009 | Wang et al. | 330/258 |
| 2002/0171494 A1 | | 11/2002 | Debaty | |
| 2007/0096825 A1 | | 5/2007 | Okuyama | |

FOREIGN PATENT DOCUMENTS

EP 0 259 879 A2 3/1988
JP 2007-124494 5/2007

OTHER PUBLICATIONS

European Search Report dated Apr. 29, 2009.

* cited by examiner

*Primary Examiner*—Patricia Nguyen
(74) *Attorney, Agent, or Firm*—McGinn IP Law Group, PLLC

(57) ABSTRACT

An operational amplifier in accordance with one embodiment of the present invention includes a differential amplifier circuit to perform differential amplification of an input signal with respect to a reference potential Vbias, an output circuit to output a signal amplified by the differential amplifier circuit, a phase compensation capacitance connected between the output of the differential amplifier circuit and the output of the output circuit to compensate the phase of the signal output from the output circuit, and a diode connected in parallel with the phase compensation capacitance.

19 Claims, 8 Drawing Sheets

OPERATIONAL AMPLIFIER AND INTEGRATING CIRCUIT

BACKGROUND

1. Field of the Invention

The present invention relates to an operational amplifier and an integrating circuit, in particular an operational amplifier and an integrating circuit having a phase compensation capacitance.

2. Description of Related Art

An integrating circuit to output a signal generated by integrating the current or the voltage of an input signal has been well known. Such an integrating circuit operates by repeating an integration period during which electrical charge is charged to a capacitive element and a reset period during which the electrical charge is discharged from the capacitive element. The signal amplification by the integrating circuit also amplifies an input noise component as well as the input signal component. However, it is possible to reduce the input noise component by lowering the frequency band of the integrating circuit. In order to lower the frequency band of an integrating circuit operating in a predetermined cycle, the reset period needs to be shortened and the integration period needs to be lengthened.

The reset time Trs necessary for the reset action of an integrating circuit using an operational amplifier is determined by the capacitance value Cc of the phase compensation capacitance, the current Ic flowing to the phase compensation capacitance, and the potential difference Vc of the phase compensation capacitance, and expressed as Trs=Vc·Cc/Ic. To shorten this reset period, the current consumption of the operational amplifier needs to be increased or the phase compensation capacitance of the operational amplifier needs to be reduced. Since the phase compensation capacitance has a trade-off relation with the circuit stability of the operational amplifier, in general, the reset period is shortened by increasing the current consumption.

FIG. 6 is the circuit diagram of an integrating circuit shown in FIG. 10 of Japanese Unexamined Patent Application Publication No. 2007-124494. This integrating circuit includes an operational amplifier 17, an input current source 21, a reset switch 19a, and an integrating capacitance 18. The integrating capacitance 18 and the reset switch 19a are connected in parallel between the inverting input terminal and the output terminal 23 of the operational amplifier 17. The integrating capacitance 18 is charged and discharged by the current Iin from the input current source 21, and the voltage integrated by these charge and discharge is output from the output terminal 23 as an output voltage Vout.

FIG. 7 is a timing chart showing the operation of the integrating circuit in FIG. 6. The input current source 21 outputs the current Iin in the positive direction or the negative direction as shown in FIG. 7. The reset switch 19a is a switch to perform a reset action by charging or discharging the integrating capacitance 18 in response to a control signal Prs. It turns on and off by a transfer gate 19 and an inverter 20 at the timing shown in FIG. 7.

The operational amplifier 17 includes a bias circuit 14, a differential amplifier stage 15, and a source-grounded amplifier stage 16. The operational amplifier 17 further includes a phase compensation resistor 5 and a phase compensation capacitance 6 in order to prevent oscillation.

At the bias circuit 14, a constant current is supplied to the P-channel MOSFET 10 by a constant current source 13. A current I1 and a current I4 are supplied to the differential amplifier stage 15 and the source-grounded amplifier stage 16 respectively by a current mirror circuit composed of P-channel MOSFETs 10, 11, and 12.

In the differential amplifier stage 15, a reference voltage Vbias is input to a non-inverting input node 2a, and an input voltage Vin based on the input current Iin is input to an inverting node 1a. Then, differential amplification is performed by a differential pair composed of P-channel MOSFETs 1 and 2 and a current mirror circuit composed of N-channel MOSFETs 3 and 4.

In the source-grounded amplifier stage 16, the drain current of an N-channel MOSFET 7 is changed in accordance with a voltage at a node 9, which serves as the output of the differential amplifier stage 15, and thus the output voltage Vout is changed.

In a period C' shown in FIG. 7, since the input current previously swings widely in the positive direction, the output voltage Vout of the operational amplifier saturates at a VSS level. In this period, the imaginary short of the differential amplifier stage 15 is collapsed, and the inverting input voltage Vin rises with respect to the non-inverting input voltage Vbias.

Therefore, the gate-source voltage Vgs of the P-channel MOSFET 1 on the inverting input side becomes smaller, and almost no current flows to the P-channel MOSFET 1. That is, the current I2 becomes almost zero, and the current I1 becomes nearly equal to the current I3. Furthermore, almost no current flows to the N-channel MOSFET 4 likewise because of the current mirror circuit composed of the N-channel MOSFETs 3 and 4 of the differential amplifier stage 15. Therefore, the current I3 is supplied to the phase compensation capacitance 6.

The phase compensation capacitance 6 is charged and discharged by the current I3. At this point, since a potential Vco on the output terminal 23 side of the phase compensation capacitance 6 (which is called "output side" hereinafter) is always equal to the output voltage Vout, it is also saturated at the VSS level. Therefore, a potential Vci on the phase compensation resistor 5 side of the phase compensation capacitance 6 (which is called "input side" hereinafter) rises. Specifically, although an equation Vci=Vds(4) holds, the value Vds(4) is not settled in the period C' as shown in FIG. 7. Then, the potential Vci rises to the level expressed as Vci=VDD−Vds(11)−Vds(2). In these equations, Vds(4) is the drain-source voltage of the N-channel MOSFET 4, Vds(11) is the drain-source voltage of the P-channel MOSFET 11, and Vds(2) is the drain-source voltage of the P-channel MOSFET 2. As a result, since the potential difference Vc of the phase compensation capacitance 6 is expressed as Vc=Vout−Vci, it increases to the minus side.

In a period G' shown in FIG. 7, since the input current previously swings widely in the negative direction, the output voltage Vout of the operational amplifier saturates at a VDD level. In this period, the imaginary short of the differential amplifier stage 15 is collapsed, and the inverting input voltage Vin falls with respect to the non-inverting input voltage Vbias.

Therefore, the gate-source voltage Vgs of the P-channel MOSFET 1 on the inverting input side becomes larger, and almost the entire current flows to the P-channel MOSFET 1. That is, the current I1 becomes nearly equal to the current I2. Furthermore, substantially the same amount of current as the current I2 flows from the current I4 to the N-channel MOSFET 4 likewise because of the current mirror circuit composed of the N-channel MOSFETs 3 and 4 of the differential amplifier stage 15.

The phase compensation capacitance 6 is charged and discharged by the current I4. At this point, since the output side potential of the phase compensation capacitance 6 is saturated at the VDD level, the input side potential Vci of the phase compensation capacitance 6 falls. Specifically, the potential Vci falls to the level expressed as Vci=Vds(4)≈VSS as shown in FIG. 7. As a result, the potential difference Vc of the phase compensation capacitance 6 increases to the plus side.

The input potentials of the phase compensation capacitance 6 in periods C and G shown in FIG. 7 are determined by the drain-source voltage Vds of the N-channel MOSFET 4. When the differential input of the differential amplifier stage 15 is composed of P-channel MOSFET(s), the potential fluctuations on the input side of the phase compensation capacitance 6 in a saturated state is larger in the period C' where it swings upward than in the period G' where it swings downward. Therefore, the time necessary to reset the potential difference Vc of the phase compensation capacitance 6 becomes its maximum in the period C' where it is saturated at the VSS level. The reset time is determined based on the length of this time.

Since potential difference Vc of the phase compensation capacitance 6 becomes larger when it saturates at the VSS level, the reset time necessary to reset the potential difference Vc in such a state needs to be lengthened. Since the integration period becomes shorter with the increase of the reset time, the frequency band of the integration becomes higher, and thus the noise will increase.

Furthermore, in order to shorten the reset time, the current consumption (I1 and I4) of the operational amplifier needs to be increased or the phase compensation capacitance 6 of the operational amplifier needs to be reduced. Since the circuit stability of the operational amplifier deteriorates with the decrease of the phase compensation capacitance 6, in general, the reset time is shortened by increasing the current consumption. Therefore, the current consumption of the operational amplifier increases.

FIG. 8 is the circuit diagram of an integrating circuit shown in FIG. 1 of Japanese Unexamined Patent Application Publication No. 2007-124494. In contrast to the circuit shown in FIG. 6, it includes a charge/discharge control circuit 25 to control the charge and discharge of the phase compensation capacitance 6 in accordance with a signal Psw, which is in synchronization with the control signal Prs. By connecting one end of the phase compensation capacitance 6 to the VSS and the other end to the reference voltage Vbias, it enables a high-speed reset regardless of the slew rate that is determined within the operational amplifier.

However, the integrating circuit shown in FIG. 1 of Japanese Unexamined Patent Application Publication No. 2007-124494 requires an external high-power current source, and therefore the external circuit becomes larger in scale. Furthermore, there is another problem that the overall current consumption including the current consumption by the external circuit increases.

SUMMARY

In accordance with one embodiment of the present invention, an operational amplifier includes: a differential amplifier circuit to perform differential amplification of an input signal with respect to a reference potential; an output circuit to output a signal amplified by the differential amplifier circuit; a phase compensation capacitance connected between the differential amplifier circuit and the output circuit to compensate the phase of the signal output from the output circuit; and a diode connected in parallel with the phase compensation capacitance.

Furthermore, in accordance with another embodiment of the present invention, an integrating circuit includes: an operational amplifier; an integrating capacitance connected in parallel with the operational amplifier; and a reset switch connected in parallel with the integrating capacitance; wherein the operational amplifier includes: a differential amplifier circuit to perform differential amplification of an input signal with respect to a reference potential; an output circuit to output a signal amplified by the differential amplifier circuit; a phase compensation capacitance connected between the differential amplifier circuit and the output circuit to compensate the phase of the signal output from the output circuit; and a diode connected in parallel with the phase compensation capacitance.

The present invention can provide an operational amplifier that is capable of performing a high-speed reset action and has low power consumption.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 6:
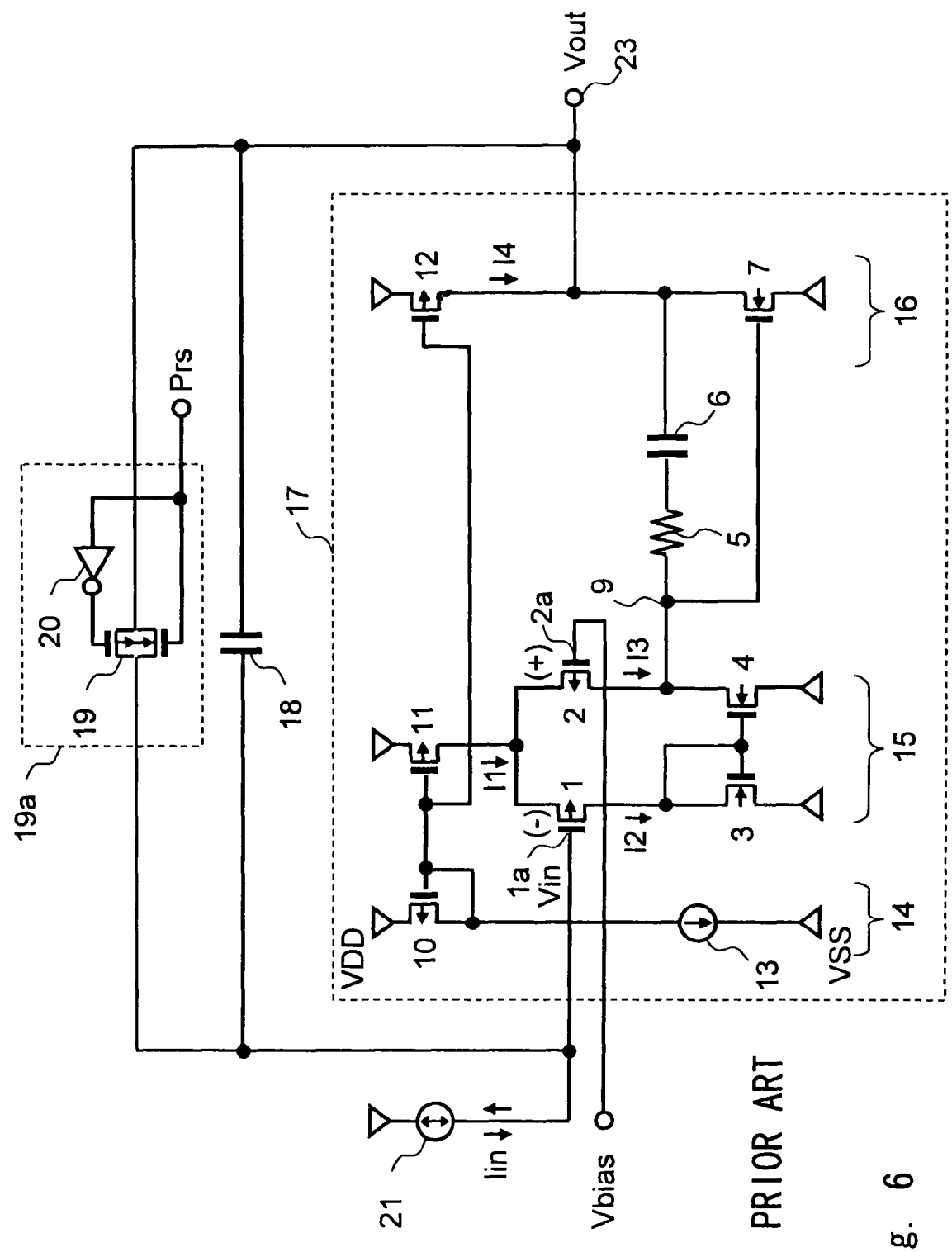
FIG. 6 is a circuit configuration diagram of an integrating circuit shown in FIG. 10 of Japanese Unexamined Patent Application Publication No. 2007-124494.
Figure 7:
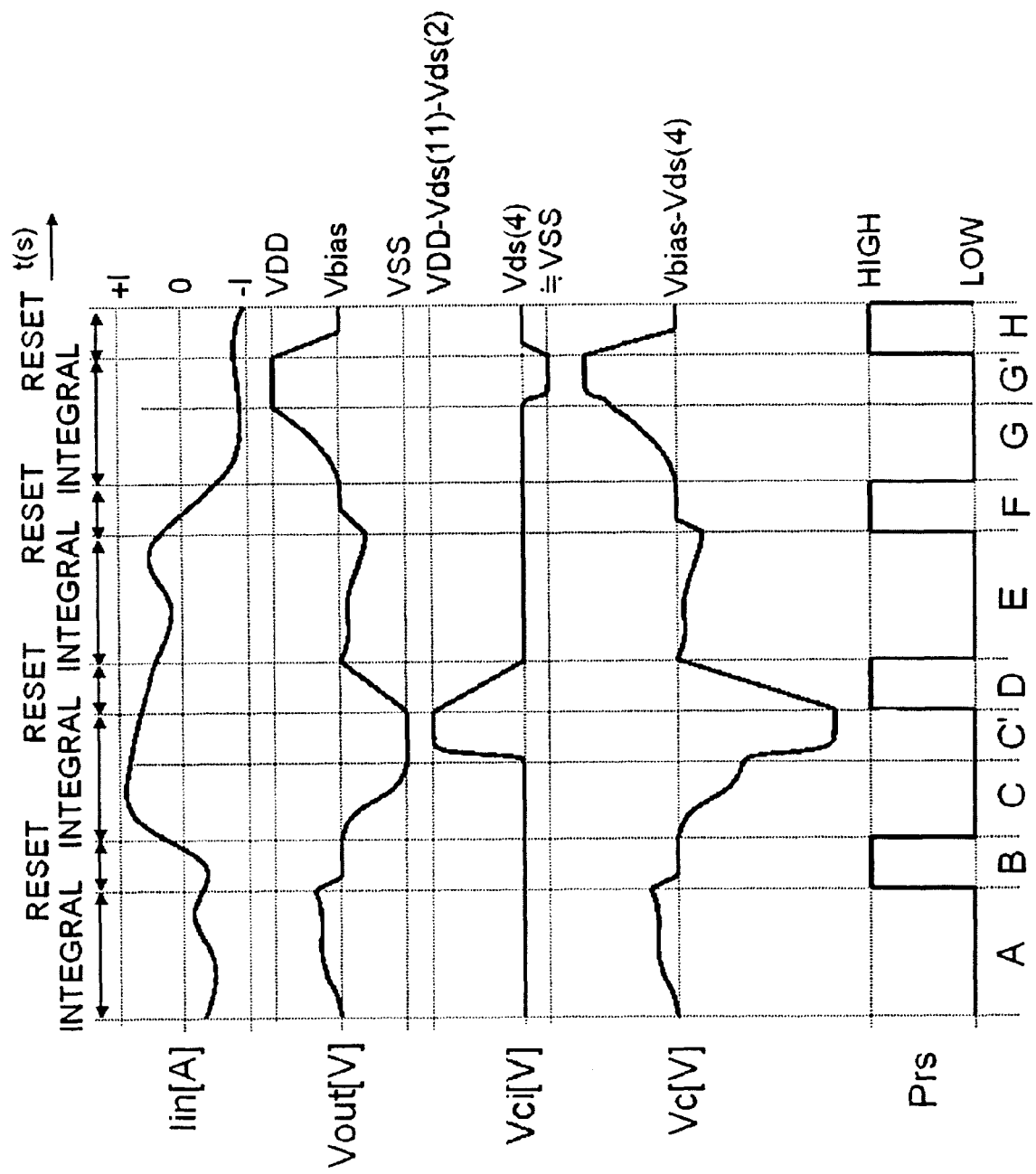
FIG. 7 is a timing chart for illustrating a problem in the integrated circuit.
Figure 8:
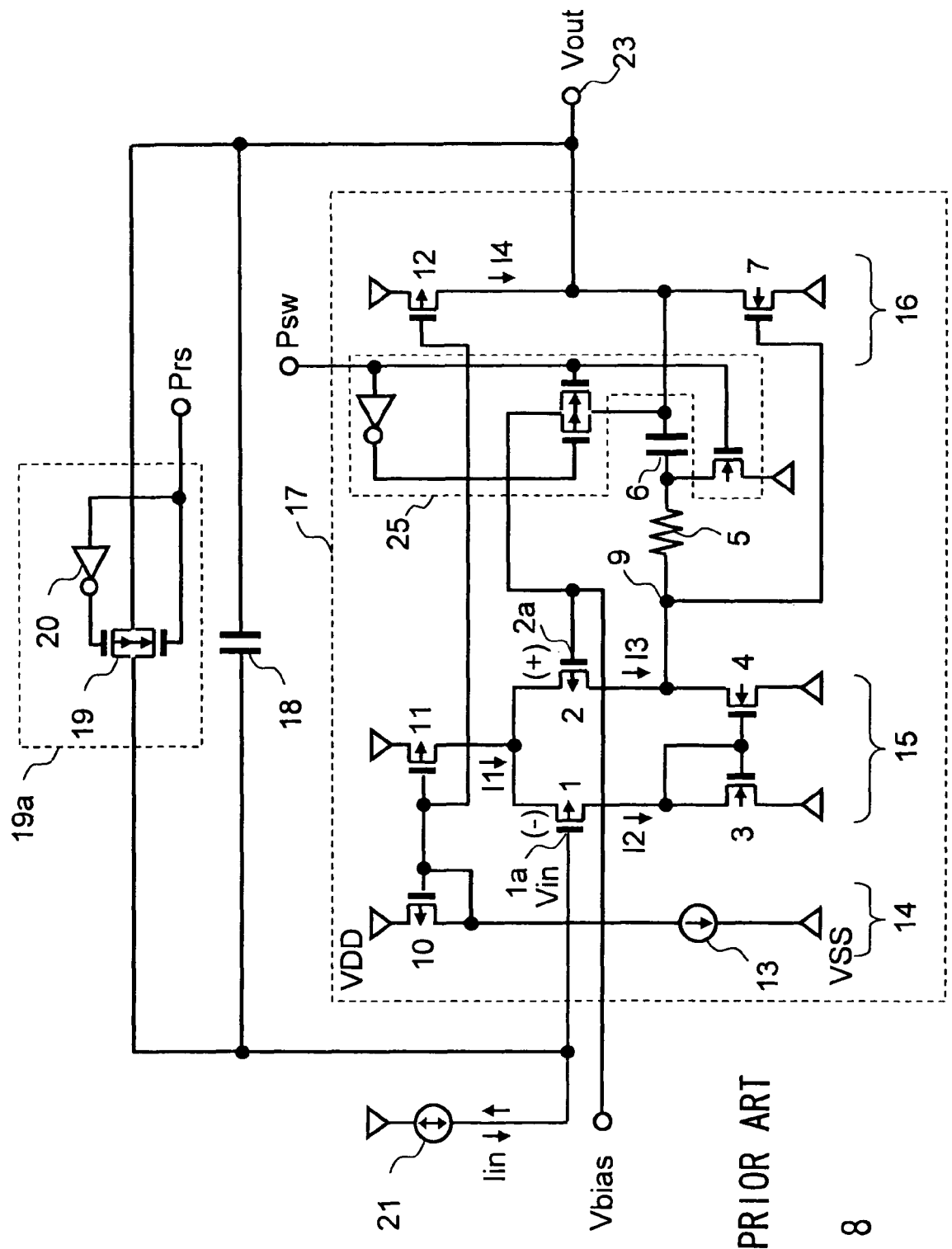
FIG. 8 is a circuit configuration diagram of an integrating circuit shown in FIG. 1 of Japanese Unexamined Patent Application Publication No. 2007-124494.

The circuit configuration of an integrating circuit in accordance with an exemplary embodiment of the present invention is explained with reference to FIG. 1. The general configuration of this integrating circuit is similar to that of FIG. 6. That is, this integrating circuit includes an operational amplifier 130, an input current source 145, a reset switch 144, and an integrating capacitance 141.

A reference voltage Vbias (first input signal) is input to the non-inverting input terminal (first input terminal) 122 of the operational amplifier 130, and an input current Iin (second input signal) is input from the input current source 145 to the inverting input terminal (second input terminal) 121 of the operational amplifier 130. Furthermore, the integrating capacitance 141 and the reset switch 144 are connected in parallel between the inverting input terminal 121 and the output terminal 126 of the operational amplifier 130. The integrating capacitance 141 integrates the input current Iin by charging and discharging.

The reset switch 144 is a switch to perform a reset action by charging or discharging the integrating capacitance 141 in response to a control signal Prs. The control signal Prs is a signal to turn on and off the reset switch 144, and to perform the reset action by establishing a voltage follower connection with the integrating capacitance 141 and the operational amplifier 130.

The reset switch 144 has a transfer gate 142 and an inverter 143. The transfer gate 142 is composed of parallel-connected N-channel MOSFET and P-channel MOSFET. Both ends of the parallel-connected MOSFETs are connected to their respective ends of the integrating capacitance 141. The control signal Prs is input to the gate of the N-channel MOSFET. A signal generated by inverting the control signal Prs with the inverter 143 is input to the gate of the P-channel MOSFET. The transfer gate 142 turns on and short-circuits both ends of the integrating capacitance 141 when the control signal Prs is at a high level, and turns off and brings both ends of the integrating capacitance 141 into a non-shorted state (opened state) when the control signal Prs is at a low level.

The operational amplifier 130 includes a bias circuit 131, a differential amplifier stage 132, a source-grounded amplifier stage 133, and a phase compensation circuit 134.

The bias circuit 131 supplies predetermined currents to the differential amplifier stage 132 and the source-grounded amplifier stage 133. The bias circuit 131 has a constant current source 109 and a mirror transistor 110, which are connected in series between a power supply voltage VDD and a ground voltage GND. The mirror transistor 110 constitutes a current mirror circuit with a mirror transistor 111 of the differential amplifier stage 132 and a mirror transistor 107 of the source-grounded amplifier stage 133. Therefore, currents generated by the constant current source 109 are supplied to the differential amplifier stage 132 and the source-grounded amplifier stage 133. The mirror transistor 110 is a P-channel MOSFET. The source of the mirror transistor 110 is connected to the power supply voltage VDD, and the drain is connected to the ground voltage GND through the constant current source 109. The gate of the mirror transistor 110 is connected to the gates of the mirror transistor 111 and the mirror transistor 107. Furthermore, the gate and the drain of the mirror transistor 110 are connected with each other.

The differential amplifier stage 132 performs differential amplification for a signal input from the inverting input terminal 121 and a signal input from the non-inverting input terminal 122. The differential amplifier stage 132 has a mirror transistor 111, differential pair transistors 101 and 102, and mirror transistors 103 and 104, all of which are disposed between the power supply voltage VDD and the ground voltage GND.

The mirror transistor 111 generates a current I1 by the current mirror circuit composed of the mirror transistor 111 and the mirror transistor 110, and supplies it to the differential pair transistors 101 and 102. The mirror transistor 111 is a P-channel MOSFET. The source of the mirror transistor 111 is connected to the power supply voltage VDD, and the drain is connected to a node 120 between the differential pair transistors 101 and 102.

The differential pair transistors 101 and 102 constitute a differential pair. The differential pair transistor 101 generates a current I2 in accordance with a signal at the inverting input terminal 121, and the differential pair transistor 102 generates a current I3 in accordance with a signal at the non-inverting input terminal 122. Both of the differential pair transistors 101 and 102 are P-channel MOSFETs. The sources of the differential pair transistors 101 and 102 are connected with each other through the node 120. The gate of the differential pair transistor 101 is connected to the inverting input terminal 121. The gate of the differential pair transistor 102 is connected to the non-inverting input terminal 122.

The mirror transistors 103 and 104 are connected between the differential pair transistors 101, 102 and the ground voltage GND. The mirror transistors 103 and 104 constitute a current mirror circuit. Therefore, the same amount of current flows through the mirror transistor 104 as the current I2 flowing through the mirror transistor 103. As a result, a differential amplifier signal expressed as a current I3-I2 is output from the output node 123 of the differential amplifier stage 132. Both of the mirror transistors 103 and 104 are N-channel MOSFETs. The gates of the mirror transistors 103, 104 and the drain of the mirror transistor 103 are connected with each other. The drain of the mirror transistor 103 is also connected to the drain of the differential pair transistor 101, and the source is connected to the ground voltage GND. The drain of the mirror transistor 104 is connected to the drain of the differential pair transistor 102 through the node 123, and the source is connected to the ground voltage GND.

The source-grounded amplifier stage 133 is an active add-on type amplifier circuit, and serves as an output circuit to amplify a signal that is differentially amplified by the differential amplifier stage 132 and to output it to the output terminal 126. The source-grounded amplifier stage 133 has a mirror transistor 107 and an output transistor 108, both of which are disposed between the power supply voltage VDD and the ground voltage GND.

The mirror transistor 107 generates a current I4 by the current mirror circuit composed of the mirror transistor 107 and the mirror transistor 110, and supplies it to the output transistor 108. The mirror transistor 107 is a P-channel MOSFET. The source of the mirror transistor 107 is connected to the power supply voltage VDD, and the drain is connected to the drain of the output transistor 108 through a node 125.

The output transistor 108 generates a signal in accordance with a voltage at the node 123 of the differential amplifier stage 132. Then, the output transistor 108 outputs a voltage Vout from the node 125 between the output transistor 108 and the mirror transistor 107 to the output terminal 126. The output transistor 108 is an N-channel MOSFET. The gate of the output transistor 108 is connected to the node 123, and the source is connected to the ground voltage GND. The output transistor 108 inverts and amplifies change in voltage at the node 123, and outputs it to the output terminal 126.

The phase compensation circuit 134 compensates the phase of a signal to be output to the output terminal 126. That is, it is a circuit to prevent oscillation. The phase compensation circuit 134 has a phase compensation resistor 105 and a phase compensation capacitance 106, which are connected in series between the node 123 of the differential amplifier stage 132 and the node 125 of the source-grounded amplifier stage 133. The phase is changed by a CR circuit composed of the phase compensation resistor 105 and the phase compensation capacitance 106, so that the oscillation is prevented. One end of the phase compensation resistor 105 is connected to the node 123, and the other end is connected to one end of the phase compensation capacitance 106 through a node 124. The other end of the phase compensation capacitance 106 is connected to the node 125.

Figure 2:
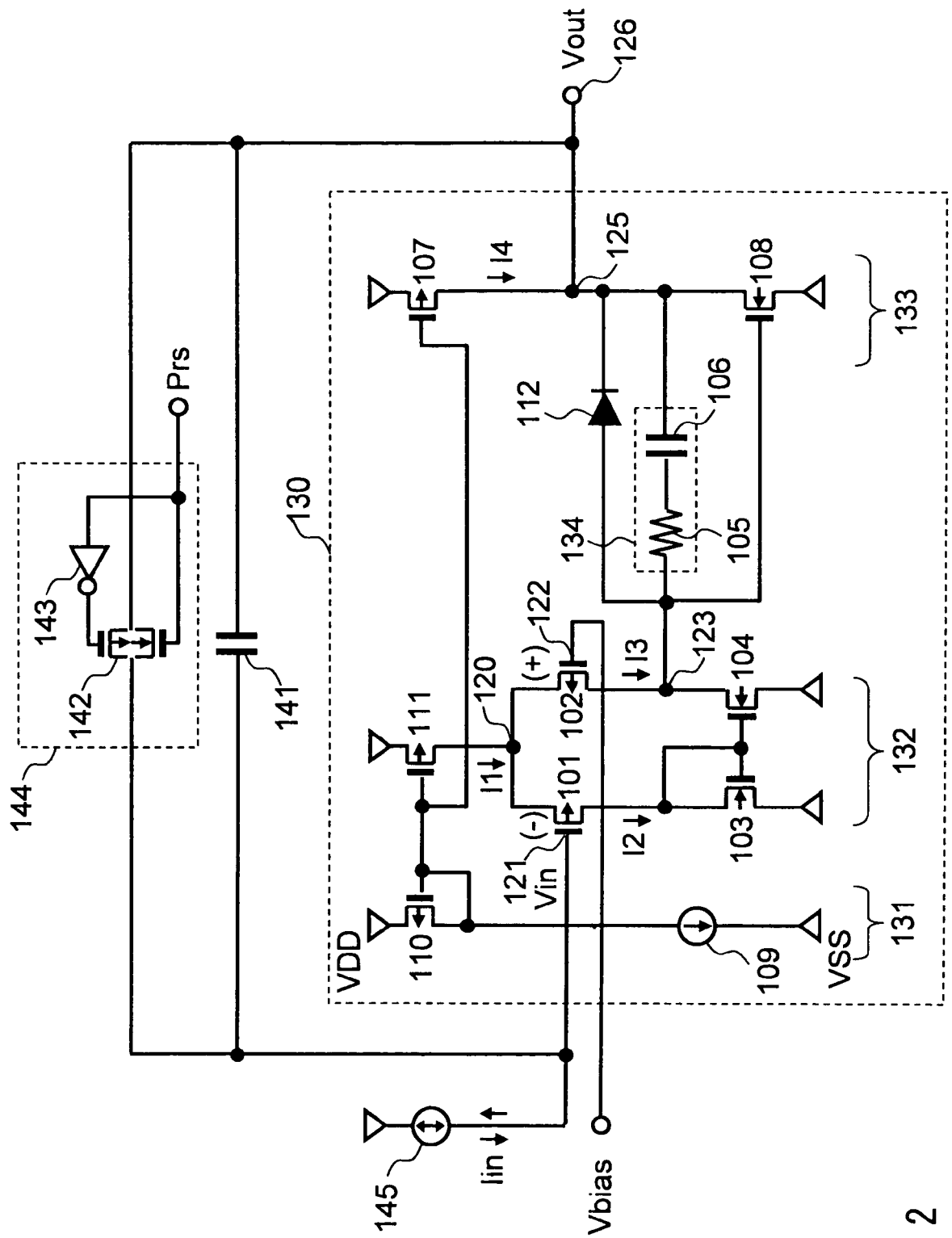
FIG. 2 is a circuit configuration diagram of another integrating circuit showing a first embodiment of the present invention.

Furthermore, a diode 112 is connected in parallel with the phase compensation capacitance 106. Specifically, the anode side of the diode 112 is connected to the node 124, and the cathode side is connected to the node 125. Note that a similar effect is achieved even when the anode side of the diode 112 is connected to the node 123 (between the phase compensation resistor 105 and the output of the differential amplifier stage 132) as shown in FIG. 2, instead of to the node 124 (between the phase compensation capacitance 106 and the phase compensation resistor 105).

Figure 3:
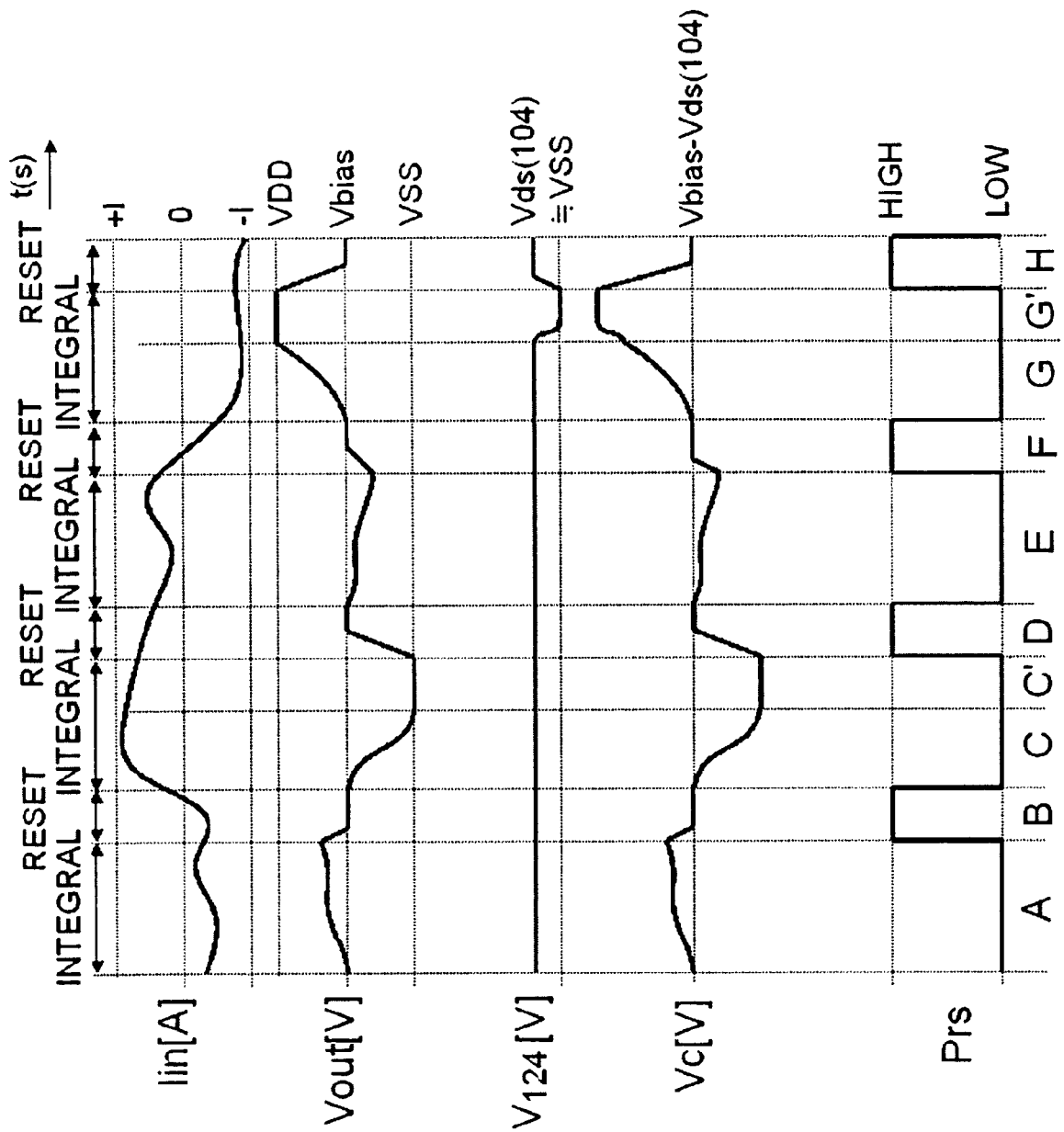
FIG. 3 is a timing chart of an integrating circuit showing a first embodiment of the present invention.

Next, the operation of an integrating circuit in accordance with an exemplary embodiment of the present invention is explained hereinafter with reference to FIG. 3. FIG. 3 shows, from top to bottom, an input current Iin, an output voltage Vout, a potential $V_{124}$ at the node 124, a potential difference Vc of the phase compensation capacitance 106, and a reset signal Prs. As shown in FIG. 3, the input current Iin is an analog signal that changes between a high level (+I) and a low level (−I), or a digital signal. Furthermore, a reset period and an integration period are repeated in a predetermined cycle. Specifically, periods A, C, C', E, G, and G' shown in FIG. 3 are integration periods, and periods B, D, F, and H are reset periods.

The integration period is a period during which the control signal Prs is at a low level and the input current Iin is integrated by the integrating capacitance 141. Therefore, the reset switch 144 is in the off-state. On the other hand, the reset switch 144 is in the on-state during the reset period since the control signal Prs is at a high level. When the reset switch 144 becomes the on-state, a voltage follower connection is established in which the output voltage Vout of the operational amplifier 130 is fed back to the input voltage Vin at the inverting input terminal 121. At this point, both ends of the integrating capacitance 141 are short-circuited, so that the potential difference becomes zero.

In the period C' shown in FIG. 3, since the input current Iin previously swings widely in the positive direction, the output voltage Vout of the operational amplifier 130 saturates at a VSS level. In this period, the imaginary short of the differential amplifier stage 132 is collapsed, and the inverting input voltage Vin rises with respect to the non-inverting input voltage Vbias.

Therefore, the gate-source voltage Vgs of the P-channel MOSFET 101 on the inverting input side becomes smaller, and almost no current flows to the differential pair transistor 101. That is, the current I1 becomes nearly equal to the current I3. Furthermore, almost no current flows to the N-channel MOSFET 104 likewise because of the current mirror circuit composed of the N-channel MOSFETs 103 and 104 of the differential amplifier stage 132. Therefore, the current I3 flows to the node 124.

A potential $V_{124}$ on the anode side of the diode 112 connected across the phase compensation capacitance 106 (i.e., at the node 124) is the drain-source voltage Vds (104) of the N-type MOSFET 104 of the differential amplifier stage 132. Meanwhile, a potential on the cathode side (i.e., at the node 125) is always equal to the output voltage Vout and saturated at the VSS level. That is, it becomes a state where a forward bias is applied to the diode 112. Therefore, almost the entire current I3 that flows to the node 124 with a forward bias equal to or higher than Vt of the diode 112 flows through the diode 112. Therefore, the potential difference Vc of the phase compensation capacitance 106 hardly changes during the period C', and remains at the potential that is settled immediately after the saturation.

In this way, it eliminates the need for the charging/discharging period necessary to restore the potential difference of the phase compensation capacitance 106 to the potential difference at the time immediately after the saturation in the reset period, and thereby enabling to shorten the reset period by a corresponding length of time. That is, it requires only the time necessary to reset from the potential difference that is settled immediately after the saturation.

A time Trs during which the output voltage Vout is reset in a reset period is determined by a current Id1 output from the differential amplifier stage 132, a capacitance value Cc of the phase compensation capacitance, and a potential difference Vc across the phase compensation capacitance. Specifically, it is expressed as Trs=(Vc·Cc)/Id1.

By connecting the diode 112 in parallel with the phase compensation capacitance 106, the potential difference Vc of the phase compensation capacitance 106 does not increase in the period during which the output voltage Vout is saturated at VSS. Therefore, the potential difference Vc becomes smaller, and thereby enabling to reduce the time Trs necessary to reset the output voltage Vout. Accordingly, the present invention can speed up a reset action from a state where the output signal of an operational amplifier is saturated without increasing the current consumption. By the speedup of the reset action, it is possible to establish a longer integration time and to reduce an input noise component.

Second Exemplary Embodiment

Figure 4:
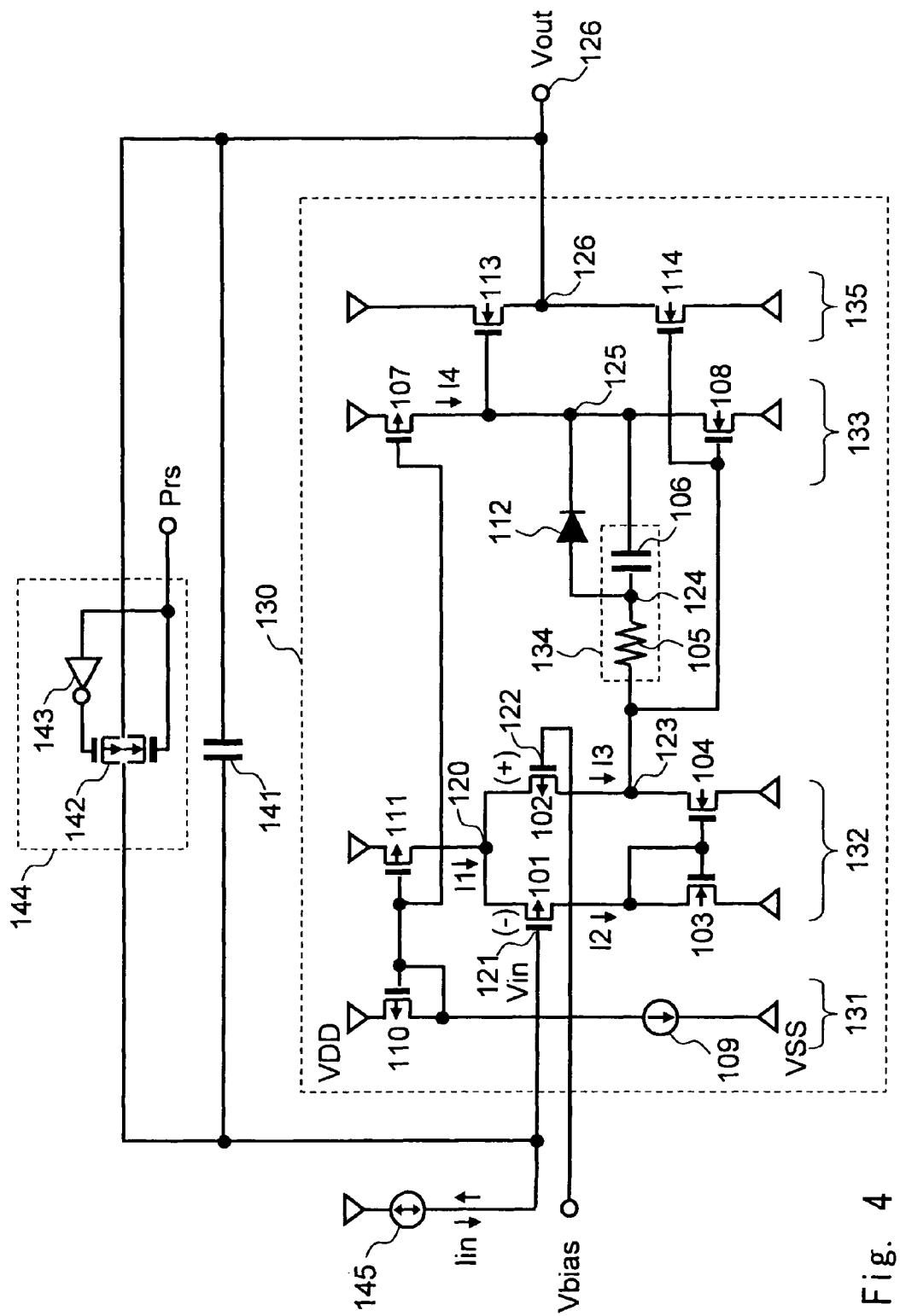
FIG. 4 is a circuit configuration diagram of an integrating circuit showing a second embodiment of the present invention.

Next, an integrating circuit in accordance with another exemplary embodiment is explained hereinafter. FIG. 4 shows a circuit diagram of an integrating circuit in accordance with another exemplary embodiment of the present invention. The same signs are assigned to the same components as those of the previous exemplary embodiment, and the explanation of them is omitted as appropriate.

The difference between the circuit diagram of an exemplary embodiment shown in FIG. 4 and the circuit diagram of an exemplary embodiment shown in FIG. 1 lies in that an output buffer circuit 135 is added in the exemplary embodiment explained hereinafter. The output buffer circuit 135 may be used in cases where the input current Iin is large or the integrating capacitance 141 is large.

The output buffer circuit 135 includes two N-channel MOSFETs 113 and 114 connected in series between the power supply voltage VDD and the ground voltage GND. The source of the N-channel MOSFET 114 is connected to the ground voltage GND, and the drain is connected to the source of the N-channel MOSFET 113 through a node 126. The gate of the N-channel MOSFET 114 is connected to the gate of the output transistor 108. Furthermore, the drain of the N-channel MOSFET 113 is connected to the power supply voltage VDD. The gate of the N-channel MOSFET 113 is connected to a node between the drain of the mirror transistor 107 and the node 125.

By using the output buffer circuit 135, the integrating capacitance 141, which would otherwise become a load to the phase compensation capacitance 106, is not directly connected to the phase compensation capacitance 106. Therefore, the phase compensation capacitance 106, which is used to achieve the circuit stability of the operational amplifier 130, can be reduced in capacity. Therefore, it becomes possible to increase the slew rate. Note that, in this embodiment, the diode 112 is also connected in parallel with the phase compensation capacitance 106 as in the case of the previous exemplary embodiment. Therefore, it is possible to further reduce the reset period without increasing the current consumption of the operational amplifier 130.

That is, by applying the present invention to a circuit in which the phase compensation capacitance is established at a smaller value while securing the circuit stability, it is possible to further reduce the reset period without increasing the current consumption of the operational amplifier. Note that a similar effect is achieved even when the cathode side of the diode is connected to the output terminal 126 (output of the output buffer circuit 135) instead of to the node 125 (output of the source-grounded amplifier stage 133).

Third Exemplary Embodiment

Figure 5:
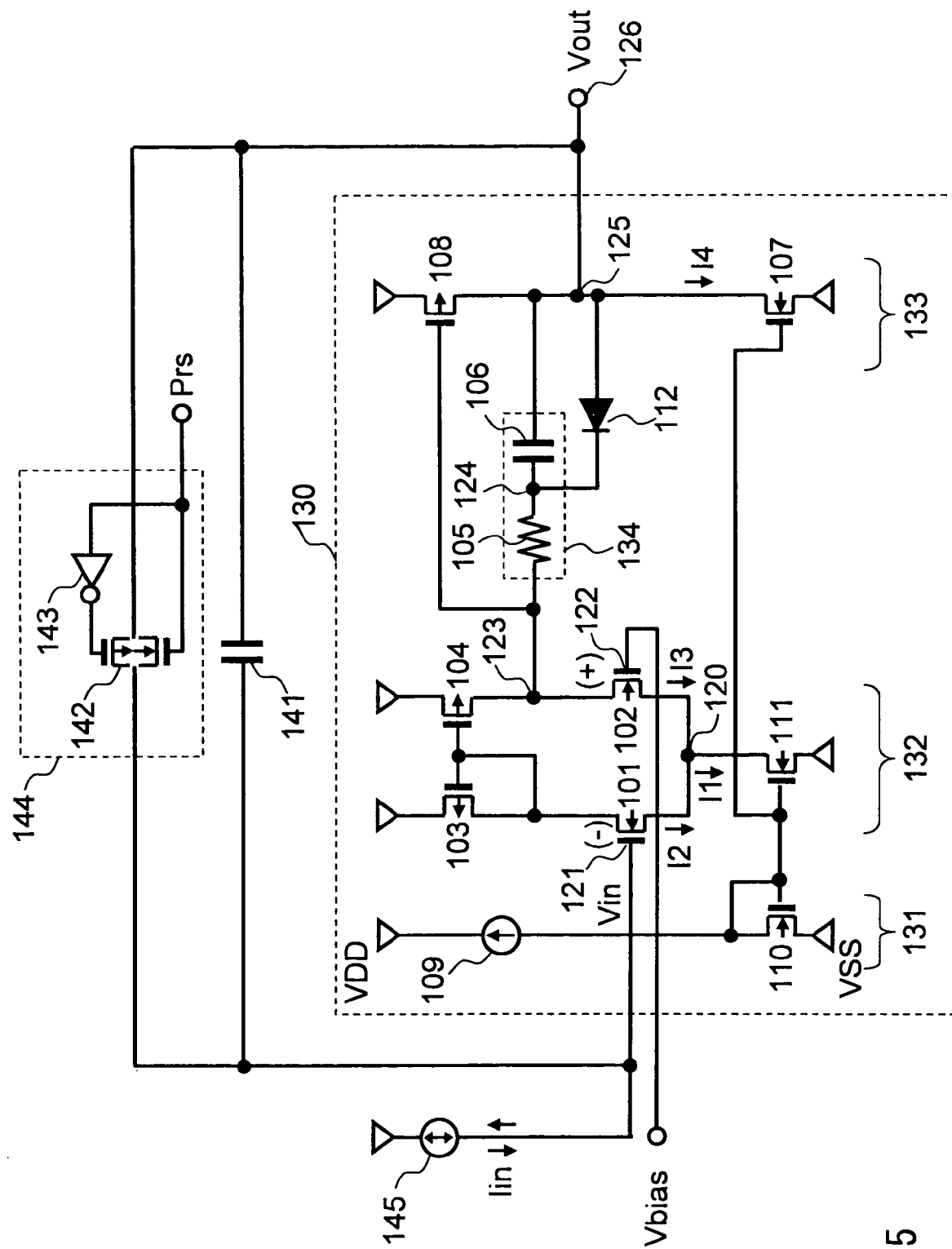
FIG. 5 is a circuit configuration diagram of an integrating circuit showing a third embodiment of the present invention.

Next, an integrating circuit in accordance with another exemplary embodiment is explained hereinafter. FIG. 5 shows a circuit diagram of an integrating circuit in accordance with another exemplary embodiment of the present invention. The same signs are assigned to the same components as those of the previous exemplary embodiments, and the explanation of them is omitted as appropriate.

Figure 1:
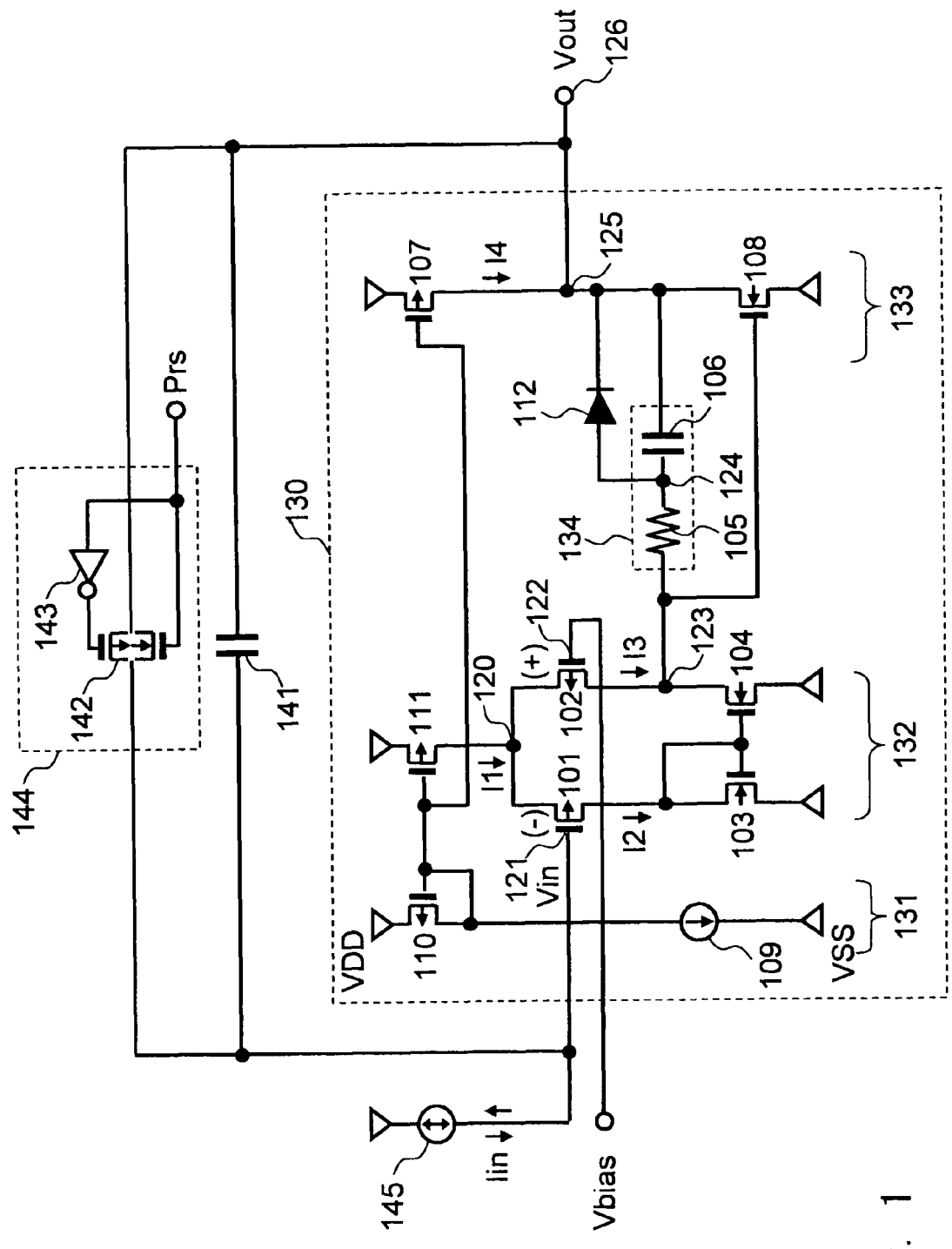
FIG. 1 is a circuit configuration diagram of an integrating circuit showing a first embodiment of the present invention.

The circuit in FIG. 5 is constructed by reversing the polarity of the MOSFETs in the operational amplifier 130 shown in FIG. 1. Similarly to the previous exemplary embodiments, a diode 112 is connected in parallel with the phase compensation capacitance 106. However, the anode side of the diode 112 is connected to the node 125, and the cathode side is connected to the node 124. In terms of the operation, while the firstly explained exemplary embodiment does not increase the phase compensation capacitance 106 in the period during which it is saturated at the VSS level, the currently explained exemplary embodiment does not increase the phase compensation capacitance 106 in the period during which it is saturated at the VDD level.

In this manner, the operation is completely similar to that of the firstly explained exemplary embodiment and a similar effect can be achieved even when the operational amplifier is configured in such a manner that the polarity of the transistors are reversed.

In addition to these modifications, various modifications and embodiments are possible without departing from the gist of the present invention. For example, although integration circuits to integrate input currents are explained above, it is also applicable to integration circuits to integrate input voltages. Furthermore, the above-described operational amplifiers are also applicable to circuits other than integration circuits. For example, it is also applicable to, instead of an integrating circuit, a feedback amplifier in which the integrating capacitance 141 is replaced with a feedback element of a different type.

The second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An operational amplifier, comprising:
    a differential amplifier circuit to perform differential amplification of an input signal with respect to a reference potential;
    an output circuit to output a signal amplified by the differential amplifier circuit;
    a phase compensation resistor with one end connected to an output of the differential amplifier circuit;
    a phase compensation capacitance connected between the other end of the phase compensation resistor and the output circuit, to compensate a phase of the signal output from the output circuit; and
    a diode connected in a parallel manner with the phase compensation capacitance.

2. The operational amplifier according to claim 1, wherein the phase compensation resistor has one end connected to the phase compensation capacitance and the diode and the other end connected to the differential amplifier circuit, the phase compensation capacitance and the diode being connected in parallel with each other.

3. The operational amplifier according to claim 1, wherein:
    the differential input of the differential amplifier circuit includes a P-channel MOSFET; and
    an anode of the diode is connected to the differential amplifier circuit side of the phase compensation capacitance and a cathode of the diode is connected to the output circuit side of the phase compensation capacitance.

4. The operational amplifier according to claim 1, wherein:
    the differential input of the differential amplifier circuit includes an N-channel MOSFET; and
    a cathode of the diode is connected to the differential amplifier circuit side of the phase compensation capacitance and an anode of the diode is connected to the output circuit side of the phase compensation capacitance.

5. The operational amplifier according to claim 1, wherein the phase compensation resistor has one end connected to the phase compensation capacitance and the other end connected to the differential amplifier circuit and the diode.

6. The operational amplifier according to claim 5, wherein:
    the differential input of the differential amplifier circuit includes a P-channel MOSFET; and
    an anode of the diode is connected to the differential amplifier circuit side of the phase compensation resistor and a cathode of the diode is connected to the output circuit side of the phase compensation capacitance.

7. The operational amplifier according to claim 5, wherein:
    the differential input of the differential amplifier circuit includes an N-channel MOSFET; and
    a cathode of the diode is connected to the differential amplifier circuit side of the phase compensation resistor and an anode of the diode is connected to the output circuit side of the phase compensation capacitance.

8. An integrating circuit, comprising:
    an operational amplifier;
    an integrating capacitance connected in parallel with the operational amplifier; and
    a reset switch connected in parallel with the integrating capacitance;
    wherein the operational amplifier includes:
        a differential amplifier circuit to perform differential amplification of an input signal with respect to a reference potential;
        an output circuit to output a signal amplified by the differential amplifier circuit;
        a phase compensation capacitance connected between the differential amplifier circuit and the output circuit to compensate a phase of the signal output from the output circuit; and
        a diode connected in a parallel manner with the phase compensation capacitance.

9. The integrating circuit according to claim 8, further comprising a phase compensation resistor having one end connected to the phase compensation capacitance and the diode and the other end connected to the differential amplifier circuit, the phase compensation capacitance and the diode being connected in parallel with each other.

10. The integrating circuit according to claim 8, wherein:
the differential input of the differential amplifier circuit includes a P-channel MOSFET; and
an anode of the diode is connected to the differential amplifier circuit side of the phase compensation capacitance and a cathode of the diode is connected to the output circuit side of the phase compensation capacitance.

11. The integrating circuit according to claim 8, wherein:
the differential input of the differential amplifier circuit includes an N-channel MOSFET; and
a cathode of the diode is connected to the differential amplifier circuit side of the phase compensation capacitance and an anode of the diode is connected to the output circuit side of the phase compensation capacitance.

12. The integrating circuit according to claim 8, further comprising a phase compensation resistor having one end connected to the phase compensation capacitance and the other end connected to the differential amplifier circuit and the diode.

13. The integrating circuit according to claim 12, wherein:
the differential input of the differential amplifier circuit includes a P-channel MOSFET; and
an anode of the diode is connected to the differential amplifier circuit side of the phase compensation resistor and a cathode of the diode is connected to the output circuit side of the phase compensation capacitance.

14. The integrating circuit according to claim 12, wherein:
the differential input of the differential amplifier circuit includes an N-channel MOSFET; and
a cathode of the diode is connected to the differential amplifier circuit side of the phase compensation resistor and an anode of the diode is connected to the output circuit side of the phase compensation capacitance.

15. An operational amplifier, comprising:
a differential amplifier circuit to perform differential amplification of an input signal with respect to a reference potential;
an output circuit to output a signal amplified by the differential amplifier circuit;
a capacitor;
a resistor serially connected to the capacitor, thereby forming a serially-connected capacitor/resistor pair, wherein the serially-connected capacitor/resistor pair is connected between the differential amplifier circuit and the output circuit to compensate the phase of the signal output from the output circuit;
a diode connected in parallel with at least a portion of the serially-connected capacitor/resistor pair;
an integrating capacitance connected in parallel with the operational amplifier; and
a reset switch connected in parallel with the integrating capacitance.

16. The operational amplifier of claim 15, wherein the diode is connected in parallel to the capacitor.

17. The operational amplifier of claim 15, wherein the diode is connected in parallel to the serially-connected capacitor/resistor pair.

18. The operational amplifier according to claim 15, wherein:
the differential input of the differential amplifier circuit includes a P-channel MOSFET, and
an anode of the diode is connected to the differential amplifier circuit side of the phase compensation capacitance and a cathode of the diode is connected to the output circuit side of the phase compensation capacitance.

19. The operational amplifier according to claim 15, wherein:
the differential input of the differential amplifier circuit includes an N-channel MOSFET, and
a cathode of the diode is connected to the differential amplifier circuit side of the phase compensation capacitance and an anode of the diode is connected to the output circuit side of the phase compensation capacitance.

* * * * *